(12) United States Patent
Kris

(10) Patent No.: US 7,126,515 B1
(45) Date of Patent: Oct. 24, 2006

(54) SELECTABLE REAL TIME SAMPLE TRIGGERING FOR A PLURALITY OF INPUTS OF AN ANALOG-TO-DIGITAL CONVERTER

(75) Inventor: Bryan Kris, Phoenix, AZ (US)

(73) Assignee: Microchip Technology Inc., Chandler, AZ (US)

( * ) Notice: Subject to any disclaimer, the term of this patent is extended or adjusted under 35 U.S.C. 154(b) by 0 days.

(21) Appl. No.: 11/236,371

(22) Filed: Sep. 27, 2005

(51) Int. Cl.
*H03M 1/00* (2006.01)

(52) U.S. Cl. .................................. 341/141; 341/155
(58) Field of Classification Search ......... 341/140–172
See application file for complete search history.

(56) References Cited

U.S. PATENT DOCUMENTS 5,257,301 A * 10/1993 Vanderbilt ................... 377/47

6,737,627 B1 * 5/2004 Moses et al. ............ 250/208.1

* cited by examiner

*Primary Examiner*—Lam T. Mai
(74) *Attorney, Agent, or Firm*—Baker Botts L.L.P.

(57) ABSTRACT

An analog-to-digital conversion apparatus for converting a plurality of analog input signals may include a plurality of analog input, a plurality of sample and hold circuits, one or more analog-to-digital converters (ADCs), a plurality of trigger selection circuits, and one or more analog multiplexers. The analog inputs may receive an analog input signals. The sample and hold circuits may include an input selectively coupled to at least one of the plurality of input and an output. The analog-to-digital converters (ADCs) may include an input and an output. The trigger selection circuits may selectively couple one of the inputs to one of the sample and hold circuits. The analog multiplexers may include a plurality of inputs selectively coupled to one or more of the sample and hold circuit outputs and an output coupled to one of the one or more analog-to-digital-converters.

19 Claims, 5 Drawing Sheets

SELECTABLE REAL TIME SAMPLE TRIGGERING FOR A PLURALITY OF INPUTS OF AN ANALOG-TO-DIGITAL CONVERTER

TECHNICAL FIELD

The present disclosure, according to one embodiment, relates to analog-to-digital converters (ADCs) used in digital systems, more particularly, to selectable real time sample triggering for a plurality of inputs of the ADC.

BACKGROUND

In power conversion applications, there is a need to measure voltages and currents for each pulse width modulation (PWM) control loop. A PWM signal controls a switch, e.g., transistor, power field effect transistor, etc., that allows an inductor to charge to a desired current. The longer the PWM signal is on, the longer the inductor is charging, and therefore the inductor current is at its maximum at the end of the PWM signal. Often, the end of the PWM signal is when current and voltage measurements should be taken for maximum accuracy and proper PWM control loop operation. Therefore, it is desirable to capture current and voltage values of a power supply component, e.g., inductor, at specific times relative to a pulse width modulation (PWM) signal that is controlling the current through the inductor of the power supply.

SUMMARY

A power supply may require multiple PWM signals to control multiple power circuits, and these multiple PWM signals may occur at random times relative to each other. However, an ADC may be limited to taking a sequence of analog input samples following a trigger event. Therefore, analog input samples for the ADC may not be able to be taken at the precise times required. Existing ADCs take an analog input sample and convert upon a command, e.g., software command or a control signal, but only after the selected "trigger" event occurs. Then the selected analog input samples are sequentially converted by the ADC to digital values. The sequential sample's timing relationship with respect to the single trigger event becomes "older" as the sequence progresses. What is needed in power supply applications is that each analog signal sample may be taken at a precise and unique time appropriate to the actual activity of that power supply circuit.

According to a specific example embodiment of this disclosure, each analog input processed by an ADC has an associated sample and hold circuit. A plurality of pairs, e.g., four pairs, of analog inputs, each pair may be associated with a unique trigger source with which to initiate a conversion process. As each pair of analog inputs receives its specified trigger signal, the analog input signals on these analog input pairs may be sampled and held until the ADC conversion logic is ready to convert the sampled analog input signals into digital values for use by a digital processor controlling the PWM control loop.

According to specific example embodiment of the present disclosure, an analog-to-digital conversion apparatus for converting a plurality of analog input signals may comprise a plurality of analog input, each of which may receive an analog input signal; a plurality of sample and hold circuits, each of which may comprise an input selectively coupled to at least one of the plurality of input and an output; one or more analog-to-digital converters (ADCs), each of which may comprise an input and an output; a plurality of trigger selection circuits, each of which may selectively couple one of the input to one of the sample and hold circuits; and one or more analog multiplexers, each of which may comprise a plurality of inputs selectively coupled to one or more of the sample and hold circuit outputs and an output coupled to one of the one or more analog-to-digital-converters.

According to another specific example embodiment of the present disclosure, a pulse width modulation (PWM) control system for monitoring a plurality of analog input signals, may comprise a plurality of analog input, each to receive an analog input signal; a plurality of sample and hold circuits, each may comprise an input selectively coupled to at least one of the plurality of input and an output; one or more analog-to-digital converters (ADCs), each ADC may comprise an input and an output; a plurality of trigger selection circuits, each may selectively couple one of the input to one of the sample and hold circuits; and one or more analog multiplexers, each analog multiplexer may comprise a plurality of inputs selectively coupled to one or more of the sample and hold circuit outputs and an output coupled to one of the one or more analog-to-digital-converters.

According to yet another specific example embodiment of the present disclosure, a method for converting a plurality of analog input signals to digital output signals may comprise associating each of the analog input signals with one or more trigger signals; detecting if one of the one or more trigger signals associated with an the analog inputs are active and when one of the one or more trigger signals associated with one of the at least one analog input is active: sending a sample request signal to a sample request latch; if a sample and hold circuit associated with the analog input signal is available, switching the analog input to the sample and hold circuit associated with the analog input signal to sample and hold the analog input associated with the at least one trigger signal; sending a sample ready signal to a request for conversion selection circuit; if an analog-to-digital converter is available, and the sample and hold circuit associated with the sampled analog input signal is the highest priority requestor, sending the sampled analog input signal to the analog to digital converter; converting the sampled and held analog input signal to a digital value; and storing the digital value in a result register.

BRIEF DESCRIPTION OF THE DRAWINGS

A more complete understanding of the present disclosure thereof may be acquired by referring to the following description taken in conjunction with the accompanying drawings wherein.

Figure 1:
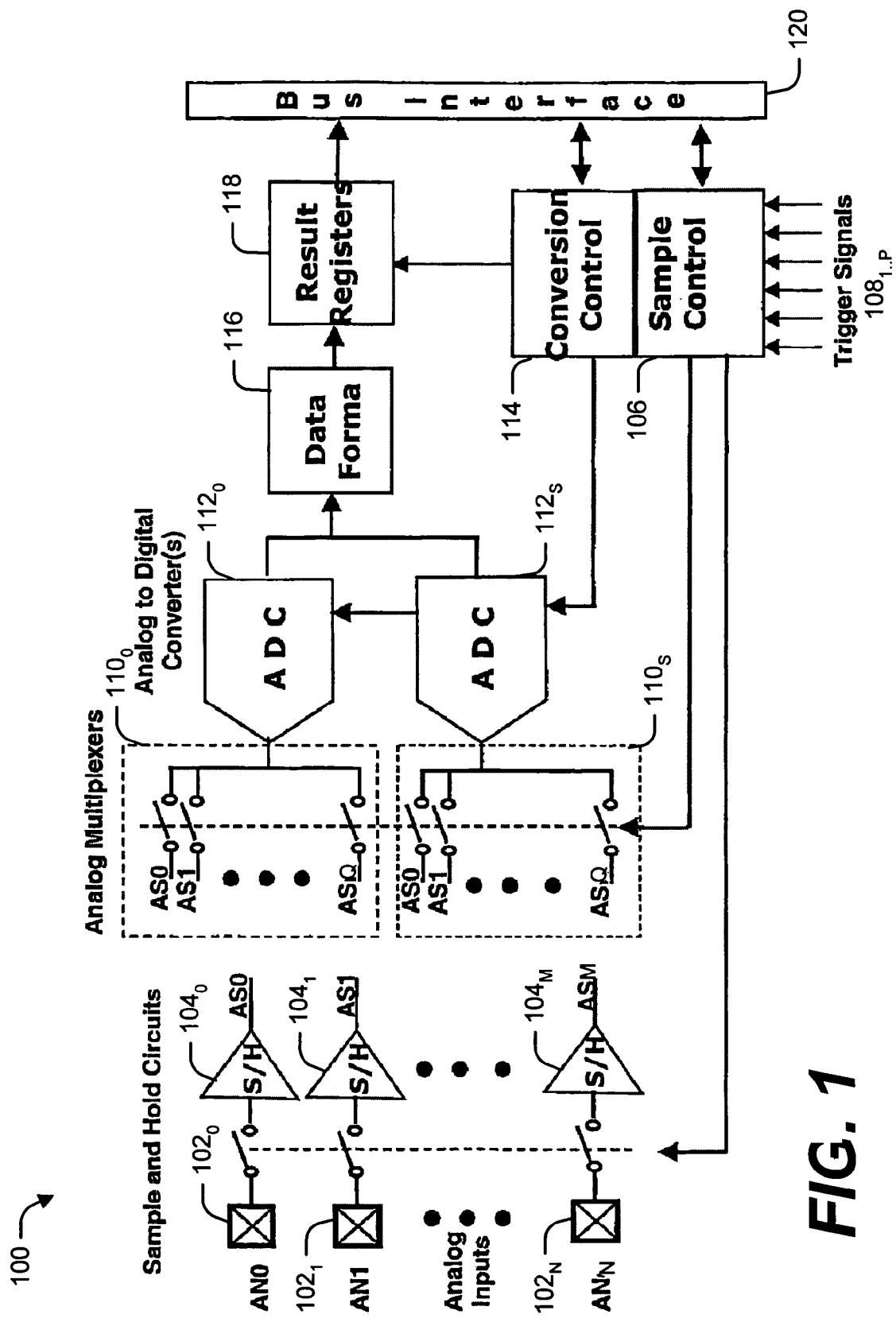
FIG. 1 is a schematic block diagram of an analog-to-digital converter (ADC) having sample and hold circuits, according to a specific example embodiment of the present disclosure.

While the present disclosure is susceptible to various modifications and alternative forms, specific example embodiments thereof have been shown in the drawings and are herein described in detail. It should be understood, however, that the description herein of specific example embodiments is not intended to limit the disclosure to the particular forms disclosed herein, but on the contrary, this disclosure is to cover all modifications and equivalents as defined by the appended claims. For example, while the apparatus, systems, and methods of the present disclosure may be useful in power control applications, they may be also be useful in other ADC applications, including, for example, data acquisition or control systems.

DETAILED DESCRIPTION

Referring now to the drawings, the details of example embodiments are schematically illustrated. Like elements in the drawings will be represented by like numbers, and similar elements will be represented by like numbers with a different lower case letter suffix.

Referring to FIG. 1, depicted is a schematic block diagram of an analog-to-digital conversion system, shown generally at 100. The analog-to-digital control system may be useful for monitoring one or more pulse width modulation (PWM) control loops. The analog-to-digital conversion system 100 includes N+1 analog input $102_{0...N}$ and M+1 sample and hold circuits $104_{0...M}$. Each of the sample and hold circuits $104_{0...M}$ includes an input to receive an input and output. Sample control logic 106 may control the connection of each of the analog input $102_{0...N}$ with an associated one of the sample and hold circuits $104_{0...M}$.

In certain example implementations, there may be one sample and hold circuit 104 dedicated to each of the analog input $102_{0...N}$. In other implementations, the number of sample and hold circuits $104_{0...M}$ may be less than the number of analog input $102_{0...N}$. For example, in one implementation, the input $102_{0...N}$ may be grouped into pairs and one sample and hold circuit 104 may be dedicated to one member each pair of input $102_{0...M}$. In such an implementation, one or more other sample and hold circuits $104_{0...M}$ may be shared by the members of each pair of input $102_{0...M}$ that do not have a dedicated sample and hold circuit 104.

In still other implementations, at least one of the analog input $102_{0...M}$ may not be selectively connected with any of the sample and hold circuits $104_{0...M}$, rather at least one of the analog input $102_{0...M}$ may be directly connected to an input of one or more analog multiplexers $100_{0...Q}$.

In one example implementation, alternating members of a pair of analog inputs (e.g., analog inputs $102_0$ and $102_1$) may be used to measure currents and voltages, respectively, in a power supply. Because currents may be more volatile than voltages, the analog input (i.e. analog input $102_0$) associated with the measured current may have a dedicated sample and hold circuit, while the analog input (i.e., analog input $102_1$) associated with the measured voltage may share one or more of the sample and hold circuits $104_{0...M}$ with other analog inputs.

In general, the sample control logic 106 may control which of the analog inputs $102_{0...N}$ are connect to one or more of the sample and hold circuits $104_{0...M}$. The sample control logic 106 may also control one or more analog multiplexers $110_{0...S}$ to connect the outputs of the sample and hold circuits $104_{0...M}$ with the inputs of one or more analog-to-digital converters $112_{0...S}$. In certain implementations where one or more of the analog inputs $102_{0...N}$ are not selectively connected to any of the sample and hold circuits $104_{0...M}$, the analog multiplexers $110_{0...S}$ may connect these analog inputs $102_{0...N}$ directly to one or more ADCs $112_{0...S}$.

Each of the ADCs $112_{0...S}$ may include an input to receive an analog signal and an output to render a digital version of the analog signal. Each of the ADCs $112_{0...S}$ may further include one or more control inputs to control the operation of the ADC 112. The analog signals applied to the input of each of the ADCs $112_{0...S}$ may be controlled by a corresponding one of the S+1 analog multiplexers $110_{0...S}$. Each of the analog multiplexers $110_{0...S}$ may have Q+1 analog inputs, shown in FIG. 1 as AS0–ASQ, a control input, and an output. In implementations of the analog-to-digital conversion system 100 where each of the analog inputs have at least one associated sample and hold circuit 104, Q may be equal to M. In other implementations where one or more of the analog inputs $102_{0...N}$ are not associated with, or not uniquely associated with, any of the sample and hold circuits $104_{0...M}$, Q may be greater than M to account for any of the analog inputs $102_{0...N}$ that do not have an associated sample and hold circuit 104. The control inputs of each of the analog multiplexers $110_{0...S}$ may receive control signals from the sample control logic 106. The control inputs of each of the ADCs $112_{0...S}$ may receive signals from the conversion control logic 114.

Once the ADCs $112_{0...S}$ have converted the received analog signals, they may output the respective digital values to data formatting circuitry 116, which may, in turn, store the formatted values to one or more result registers 118.

The analog to digital conversion system 100 may be coupled with other components through a bus interface 120. The analog to digital conversion system 100 may receive control messages via the bus interface 120. In one example implementation, one or both of the sample control logic 106 and the conversion control logic 114 may receive control messages via the bus interface 120. The to digital conversion system 100 may also output results, for example, from the result registers 118 via the bus interface 120.

Figure 2:
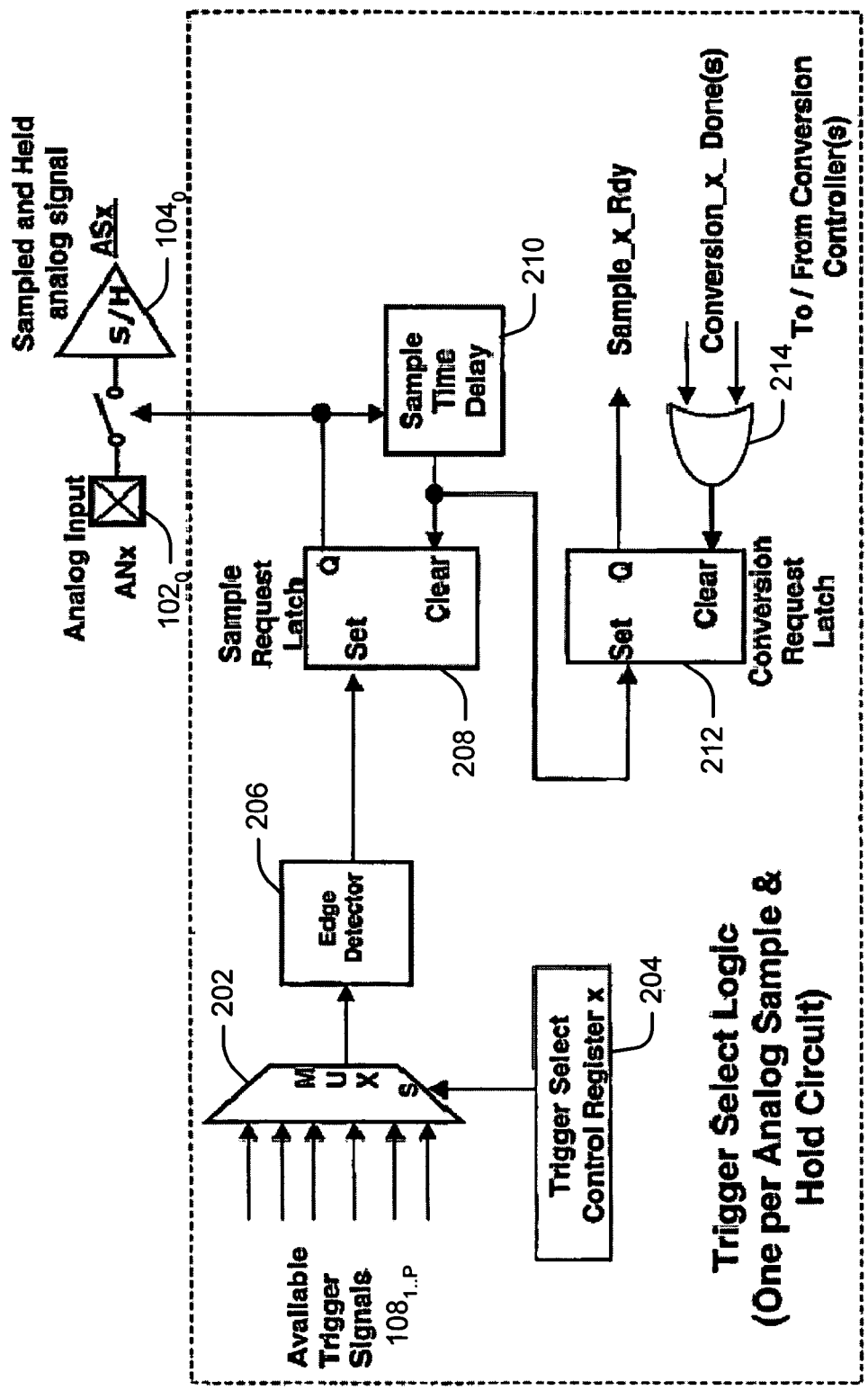
FIG. 2 is a schematic block diagram of trigger select logic, according to a specific example embodiment of the present disclosure.

Referring to FIG. 2, depicted is a schematic block diagram of a trigger select logic circuit, according to a specific example embodiment of the present disclosure. The trigger select logic may be included in sample control logic 106. The trigger select logic shown in FIG. 2 is configured to selectively couple analog input $102_0$ with sample and hold circuit $104_0$. In general, the trigger select logic selectively couples one or more of the N+1 analog input $102_{0...N}$ to one of the M+1 sample and hold circuits $104_{0...M}$. In certain embodiments according to the present disclosure, one trigger select logic may be provided for each sample and hold circuit $104_{0...M}$.

The trigger select logic may receive one or more trigger signals $108_{1...P}$ into a trigger select multiplexer 202. One of the trigger select signals $108_{1...P}$ may be selected based on a value stored in the trigger select control register 204. The value stored in the trigger select control register 204 may be static or dynamic based on the needs of the system. In certain implementations, the trigger select control register 204 may associate one of the trigger signals $108_{1...P}$ with one of the analog inputs $102_{0...N}$. In another example implementation, where a single one of the sample and hold circuits $104_{0...M}$ are switched between multiple analog inputs $102_{0...N}$, the value in the trigger select control register 204 may be varied based on which analog input $102_{0...N}$ should be accommodated.

The output of the trigger select multiplexer may be coupled to an edge detector 206. The edge detector 206 may provide a signal when the selected trigger signal is asserted. The output of the edge detector 206 may be coupled to a sample request latch 208, which causes the associated sample and hold circuit $104_0$ to sample the associated analog input $102_0$ by providing a signal on a Q output of the sample request latch 208. The sample request latch 208 may include a Clear input to reset the sample request latch 208.

The Q output of the sample request latch 208 may also be coupled to a sample time delay 210. The sample time delay 210 may further include an output coupled to a Clear input of the sample request latch 208. In general the sample time delay 210 causes the sample request latch to clear at some time after the sample time delay 210 receive an input signal from the sample request latch's Q output. The sample time delay 210 may clear the sample request latch 208 by providing a signal to the Clear input of the sample request latch 208. The output of the sample time delay 210 may further be coupled to a Set input of a conversion request latch 212. The conversion request latch 212 further comprises a Q output and a Clear Input. When the latch is activated (e.g., a signal is received on the Set input) the conversion request latch may send a signal indicating that the sample and hold circuit $104_0$ is ready for analog-to-digital conversion.

The Clear input of the conversion request latch 214 may be configured to receive a signal when the analog-to-digital conversion of sample and hold circuit 1040 is complete. In certain example implementations with multiple analog-to-digital converters $112_{0 \ldots S}$, the conversion request latch 212 may be configured to receive Conversion Done signals indicating that one of the analog-to-digital converters $112_{0 \ldots S}$ has completed the conversion of the sample and hold circuit $104_0$. For example, the Clear input of the conversion request latch 212 shown in FIG. 2 is coupled to the output of an OR gate. The inputs of the OR gate are configured to receive signals indicating that the associated analog-to-digital converter has finished converting sample and hold circuit $104_0$.

Figure 3:
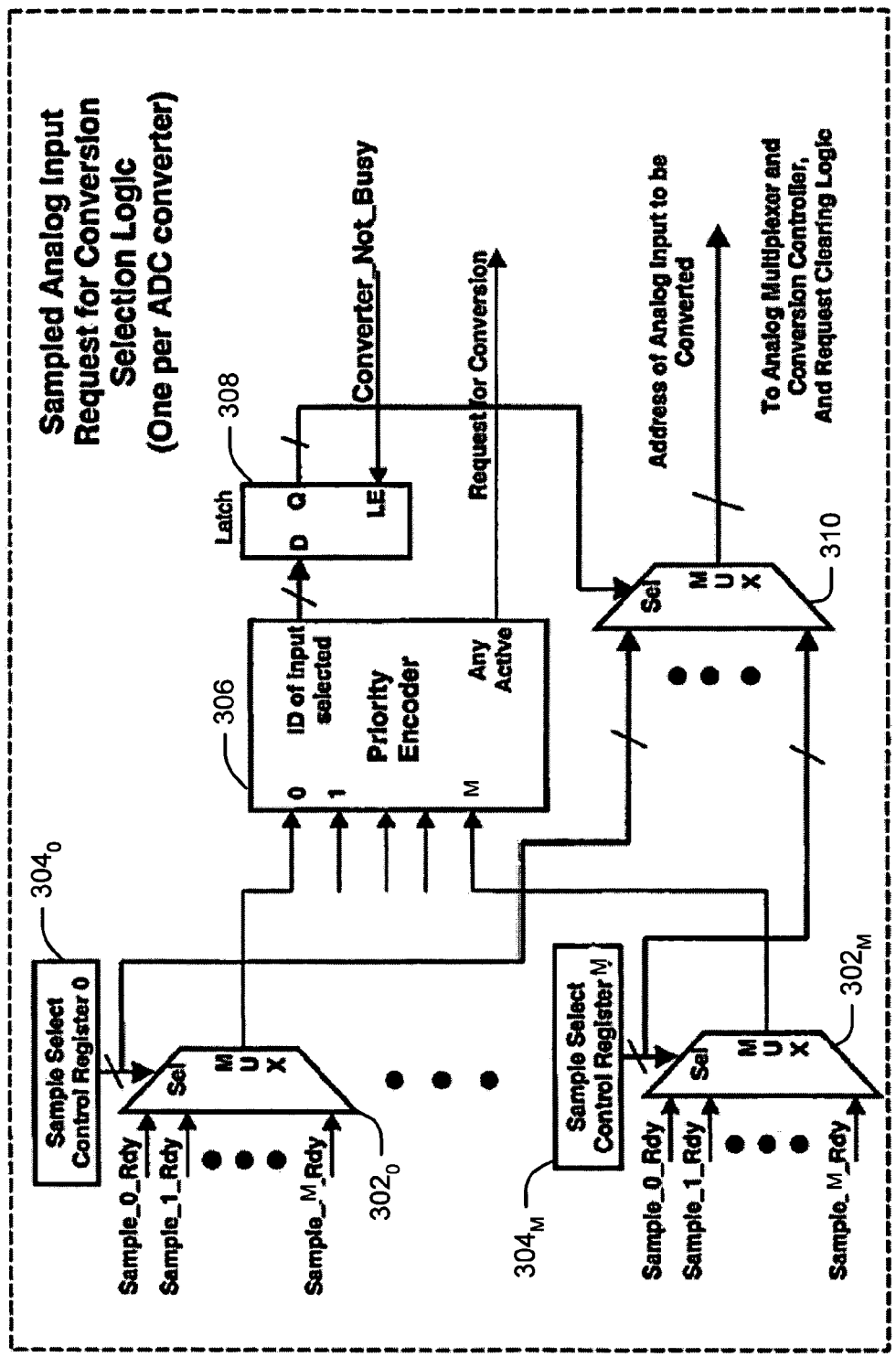
FIG. 3 is a schematic block diagram of selection of requests for conversion logic, according to a specific example embodiment of the present disclosure.

Referring to FIG. 3, depicted is a schematic block diagram of a request for conversion selection logic circuit, according to a specific example embodiment of the present disclosure. Certain example implementations may include one request for conversion logic circuit for each of the analog-to-digital converters $112_{0 \ldots S}$. The one or more request for conversion selection logic elements may be included in the sample control logic 106.

The request for conversion logic may include M+1 sample ready multiplexers $302_{0 \ldots M}$. Each of the sample ready multiplexers $302_{0 \ldots M}$ may receive M+1 inputs. In general, each of the sample ready multiplexers $302_{0 \ldots M}$ receive an input from each of the trigger select logic circuits. Each of the sample ready multiplexers $302_{0 \ldots M}$ may include a control input coupled to one of M+1 sample select control registers $304_{0 \ldots M}$. The address stored in each of the sample select control registers $304_{0 \ldots M}$ designate the address of the sample to be selected. The addresses stored in the sample ready multiplexers $304_{0 \ldots M}$ may also be input to an address selection multiplexer 310. Each of the sample ready multiplexers $302_{0 \ldots M}$ may include an output coupled to M+1 inputs of a priority encoder 306. In general, the priority encoder 306 may select which of the samples ready for conversion will be converted by the one of the analog-to-digital converters $112_{0 \ldots S}$ associated with the request for conversion logic circuit. The behavior of the priority encoder 306 may be adjusted based on the needs of the system, to give higher priority to certain samples over others. The priority encoder 306 may include an "Any Active" output that is active when at least one sample has been selected for conversion. The priority encoder 306 may include an "ID of Input Selected" output for outputting the address of the sample selected for conversion. The "ID of Input Selected" output may be input into a D input of a latch 308. The latch 308 may further include a Q output to output the value, if any, stored in the latch and a LE input for clearing the latch.

The address selection multiplexer 310 may include a control input to control which of the inputs from the sample select control registers $304_{0 \ldots M}$ are output. The control input of the address selection multiplexer 310 may be coupled to the Q output of the latch 308. In one example embodiment with such an arrangement, the address selection multiplexer may output the address of the sample selected for conversion by the priority encoder 306. The output of the address selection multiplexer 310 may be coupled to the one or more analog multiplexers $110_{0 \ldots S}$, causing them to select the output of one of the sample and hold circuits $104_{0 \ldots M}$ as the input for the ADC 112 associated with the analog multiplexer 110.

Figure 4:
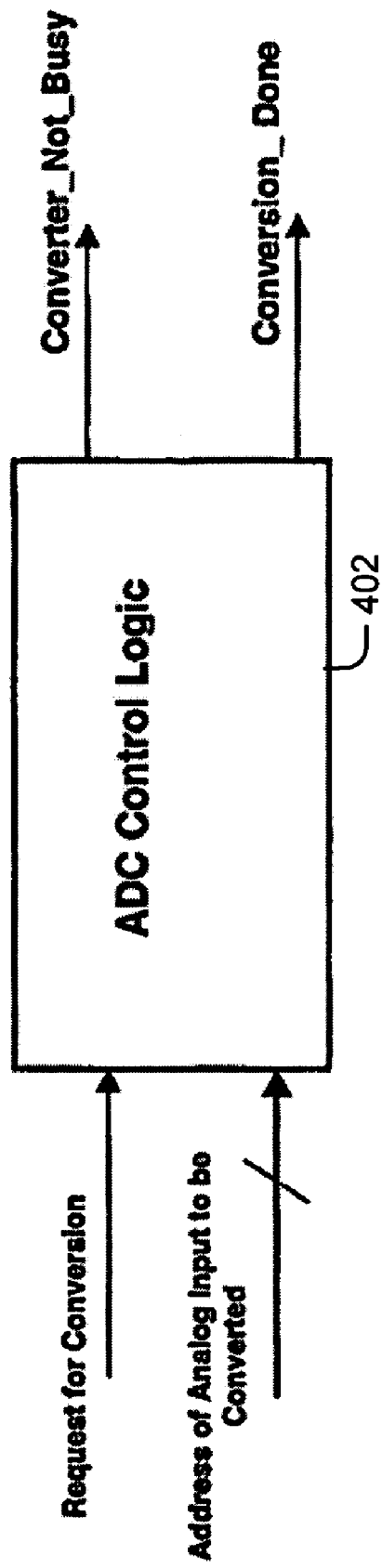
FIG. 4 is a schematic block diagram of ADC control logic, according to a specific example embodiment of the present disclosure.

Referring to FIG. 4, depicted is a schematic block diagram of ADC control logic and, according to a specific example embodiment of the present disclosure. In certain implementations, one ADC control logic circuit 402 is provided for, and associated with, each of the ADCs $112_{0 \ldots S}$. The ADC control logic circuit 402 includes a "Request for Conversion" input and an address input to receive the address of the analog input to be converted. The "Request for Conversion" input may be coupled to the "Request for Conversion" output of the priority encoder 306 of one of the request for conversion logic circuits. Likewise, the address input may be coupled to the output of the address selection multiplexer 310 of one of the request for conversion logic circuits.

In general the ADC control logic 402 causes the associated one of the ADCs $112_{0 \ldots S}$ to receive an analog input from the address specified on the address input and output a digital result to the address in the one or more result registers 118.

The ADC control logic 402 may include a "Converter Not Busy" output, which may be coupled to the LE input of the latch 308. In operation, the "Converter Not Busy" output may cause the latch 308 to reset. The ADC control logic 402 may include a "Conversion Done" output.

Figure 5:
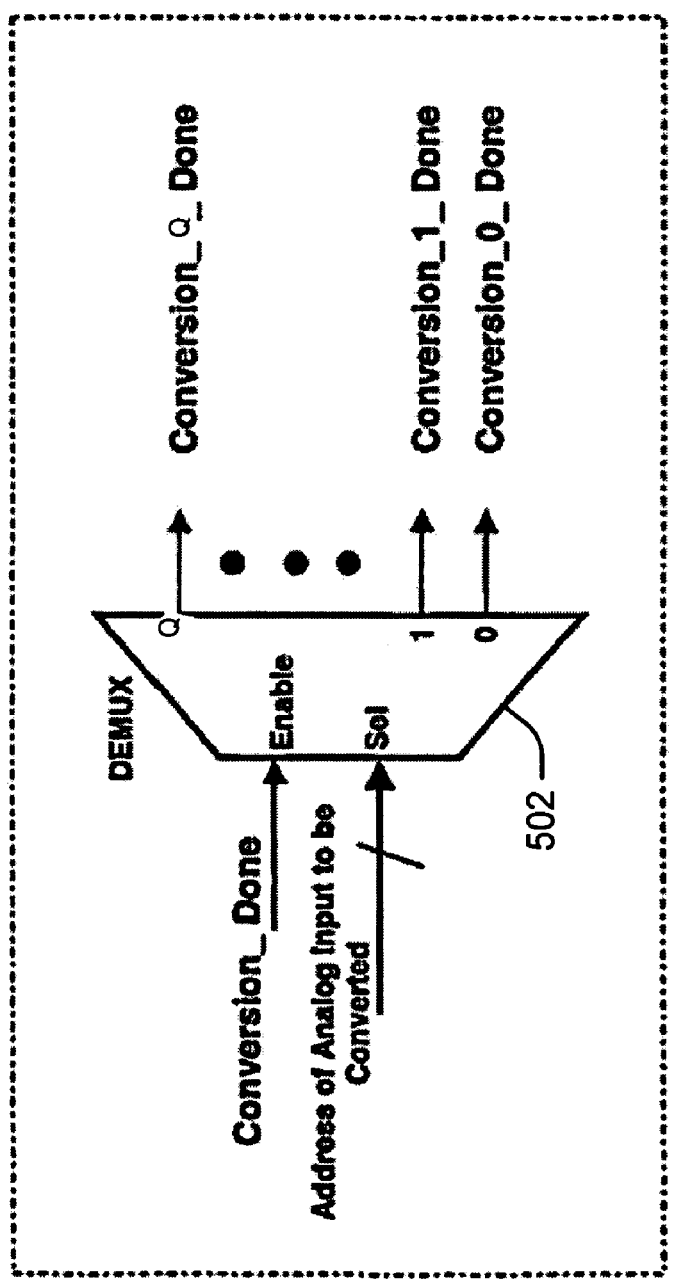
FIG. 5 is a schematic block diagram of conversion request clearing logic, according to a specific example embodiment of the present disclosure.

Referring to FIG. 5, depicted is a schematic block diagram of conversion request clearing logic, according to a specific example embodiment of the present disclosure. In general, the conversion request clearing logic may clear the latch 308 after the signal associated with the address in the conversion request latch has been converted by one of the ADCs $112_{0 \ldots S}$. The conversion request clearing logic 502 may include a demultiplexer with an Enable input, a Select input, and Q+1 outputs. The Enable input may coupled to the ADC Control Logic 402 to receive the "Conversion Done" signal. The Select input may be coupled to one of the one or more of the request for conversion selection logic circuits to receive the address of the sample selected for conversion from the output of the address selection multiplexer 310.

While embodiments of this disclosure have been depicted, described, and are defined by reference to example embodiments of the disclosure, such references do not imply a limitation on the disclosure, and no such limitation is to be inferred. The subject matter disclosed is capable of considerable modification, alteration, and equivalents in form and function, as will occur to those ordinarily skilled in the pertinent art and having the benefit of this disclosure. The depicted and described embodiments of this disclosure are examples only, and are not exhaustive of the scope of the disclosure.

What is claimed is:

1. An analog-to-digital conversion apparatus for converting a plurality of analog input signals, comprising:
   a plurality of analog inputs, each to receive an analog input signal;
   a plurality of sample and hold circuits, each comprising an input selectively coupled to at least one of the plurality of inputs and an output;
   at least one analog-to-digital converter (ADCs), each comprising an input and an output;
   a plurality of trigger selection circuits, for selectively coupling selected ones of the plurality of analog inputs to a respective one of the sample and hold circuits; and
   at least one analog multiplexer, comprising a plurality of inputs, each for selectively coupling to at least one of the sample and hold circuit outputs and an output coupled to one of the at least one analog-to-digital-converters.

2. The analog-to-digital conversion apparatus of claim 1, where each of the trigger selection circuits comprise:
   a trigger multiplexer comprising a plurality of trigger inputs, each to receive a trigger signal, a control input to receive a trigger select signal, and an output;
   a trigger select control register coupled to the trigger multiplexer control input, wherein the register is operable to store a value to control which of the plurality of trigger signals are selected by the trigger multiplexer;
   an edge detector comprising an input coupled to the trigger multiplexer output and an output, where the edge detector produces a signal when a signal from the trigger multiplexer is asserted; and
   a sample request latch comprising a set input coupled to the edge detector output, an output to cause one of the plurality of sample and hold circuits to receive an analog input signal from one of the plurality of input, and a clear input.

3. The analog-to-digital conversion apparatus of claim 2, where each trigger selection circuit further comprises:
   a sample delay circuit comprising an input coupled to a sample request latch Q output and output coupled to the sample request latch clear input, wherein the sample delay circuit causes the sample request latch to clear a predetermine time after a sample request latch Q output is active.

4. The analog-to-digital conversion apparatus of claim 2, where each trigger selection circuit further comprises:
   a conversion request latch comprising a set input coupled to the sample request latch clear input, a Q output to signal that sample and hold register associated with the trigger selection circuit is ready for conversion, and a clear input to clear the conversion request latch.

5. The analog-to-digital conversion apparatus of claim 1, wherein each of the plurality of input is associated with one sample and hold circuit.

6. The analog-to-digital conversion apparatus of claim 1, wherein the plurality of inputs are grouped into pairs and wherein each pair of input is associated with one sample and hold circuit.

7. The analog-to-digital conversion apparatus of claim 1, further comprising:
   at least one request for conversion selection circuit, each to receive sample ready signals from the plurality of trigger select logic circuits and control at least one of the analog multiplexers.

8. The analog-to-digital conversion apparatus of claim 7, where at least one of the request for conversion selection circuits comprise:
   two or more sample ready multiplexers, each comprising at least one input coupled to one of the at least one sample and hold circuits, a control input, and an output;
   a priority encoder comprising a plurality of inputs coupled to the at least one sample ready multiplexer output, an address output, and a request for conversion output;
   a conversion request latch comprising an multiplexer ID input, a multiplexer ID output, and a clear input, where the conversion request latch is operable to store a multiplexer ID of a sample to be converted; and
   an address selection multiplexer to convert the multiplexer ID output of the request conversion latch to the address of the sample to converted.

9. The analog-to-digital conversion apparatus of claim 1, further comprising: one or more registers to store conversion results.

10. A pulse width modulation (PWM) control system for monitoring a plurality of analog input signals, comprising:
    a plurality of analog inputs, each to receive an analog input signal;
    a plurality of sample and hold circuits, each comprising an input selectively coupled to at least one of the plurality of input and an output;
    at least one analog-to-digital converter (ADCs), comprising an input and an output;
    a plurality of trigger selection circuits, for selectively coupling a selected one of the plurality of analog inputs to a corresponding one of the plurality of sample and hold circuits; and
    at least one analog multiplexer, comprising a plurality of inputs selectively coupled to one or more of the sample and hold circuit outputs and an output coupled to one of the one or more ADCs.

11. The PWM control system of claim 10, wherein each of the plurality of inputs is associated with one sample and hold circuit.

12. The PWM control system of claim 10, wherein the plurality of inputs are grouped into pairs and wherein each pair of inputs is associated with one sample and hold circuit.

13. The PWM control system of claim 10, further comprising:
    at least one request for conversion selection circuit, for receiving sample ready signals from the plurality of trigger select logic circuits and for controlling one or more of the analog multiplexers.

14. The PWM control system of claim 10, further comprising: one or more registers to store conversion results.

15. A method for converting a plurality of analog input signals to digital output signals, comprising:
    associating each of the plurality of analog input signals with at least one trigger signal;
    detecting if at least one trigger signal associated with one of the analog inputs is active and, if so:
        sending a sample request signal to a sample request latch;
        if a sample and hold circuit associated with the analog input signal is available, switching the analog input to the sample and hold circuit associated with the analog input signal to sample and hold the analog input associated with the one or more trigger signals;
        sending a sample ready signal to a request for conversion selection circuit;
        if an analog-to-digital converter is available, and the sample and hold circuit associated with the sampled analog input signal is the highest priority requester, sending the sampled analog input signal to the analog to digital converter;

converting the sampled and held analog input signal to a digital value; and storing the digital value in a result register.

16. The method of claim 15, where sending a sample ready signal to a request for conversion selection circuit comprises:

sending an address of the sampled analog input signal.

17. The method of claim 15, further comprising:

storing the address of the sampled analog input signal while the sampled analog input signal is being converted to the digital value; and clearing the address of the sampled analog input signal after the sampled analog input signal is converted to the digital value.

18. The method of claim 15, further comprising:

clearing the sample and hold circuit after the sampled analog input signal is sent to the analog-to-digital converter.

19. The method of claim 15, further comprising:

outputting the digital value to a serial bus.

* * * * *